United States Patent [19]

Miller

[11] Patent Number: 4,711,997
[45] Date of Patent: Dec. 8, 1987

[54] OPTICAL INTERCONNECTION OF DEVICES ON CHIPS

[75] Inventor: David A. B. Miller, Fair Haven, N.J.

[73] Assignee: American Telephone and Telegraph Company, AT&T Bell Laboratories, Murray Hill, N.J.

[21] Appl. No.: 930,672

[22] Filed: Nov. 14, 1986

[51] Int. Cl.[4] .............................................. H01J 3/14
[52] U.S. Cl. ...................................... 250/216; 357/19; 250/551
[58] Field of Search ................... 250/216, 237 G, 551; 357/16, 17, 19; 455/606, 609

[56] References Cited

U.S. PATENT DOCUMENTS 4,124,860  10/1978  Johnson .................................. 357/19
4,367,483   1/1983  Takahashi et al. ....................... 357/19
4,525,687   6/1985  Chemla et al. ......................... 332/7.51

OTHER PUBLICATIONS

"Optical Interconnections for VLSI Systems", Proc. of the IEEE, vol. 72, No. 7, Jul. '84, J. W. Goodman et al., pp. 850–866.

Primary Examiner—Edward P. Westin
Assistant Examiner—Jessica L. Ruoff
Attorney, Agent, or Firm—Daniel D. Dubosky

[57] ABSTRACT

Devices are optically interconnected on a large scale integrated circuit by fabricating gratings on optical sources that direct the light beams toward a reflecting surface. The reflecting surface is positioned a predetermined distance from the surface of the chip such that it reflects light beams from the sources toward detectors that are fabricated on or near the surface of the chip.

6 Claims, 3 Drawing Figures

OPTICAL INTERCONNECTION OF DEVICES ON CHIPS

BACKGROUND OF THE INVENTION

This invention relates to the interconnection of devices on large scale chips, and in particular, it relates to the optical interconnection of devices on chips.

Integrated circuit chips are becoming larger and larger and the devices on them are decreasing in size thereby resulting in the creation of a problem as to how to interconnect devices at remote areas of the chip without incurring substantial delay in the transmission of information between these devices. One solution to this problem is to interconnect the devices optically. See, for example, the proposals presented in the article entitled "Optical Interconnections for VSLI Systems" by J. W. Goodman, et al., *Proceedings of the IEEE*, Vol. 72, No. 7, July, 1984, pps. 850-866. In FIG. 11 of the Goodman et al. article, the light emitted by a source on the surface of an integrated circuit chip is reflected by a hologram which is mounted a predetermined distance from the surface of the chip. A central problem with this approach is that the position of the beam directed back to the chip is critically dependent on the position of the external optical component. This is true not only of a vertical displacement of this component but also for lateral displacement of the component. For example, if the hologram is behaving like a curved mirror in reimaging the emitting device onto the detector, displacement of this hologram by a distance of $\Delta x$ will cause the image to move by the distance of $2\Delta x$. This sensitivity is a major disadvantage in such optical interconnecting schemes.

SUMMARY OF THE INVENTION

In accordance with the present invention, the sensitivity to lateral alignment of the external component in a system that connects optical sources and detectors on a chip is completely eliminated, and the requirement of vertical alignment is easily met by techniques well established in the semiconductor processing art. The holographic elements used to direct the beam of light from the optical sources are formed directly on the surface of the chip over the optical sources. They are fabricated directly on the surface of the chip using alignment techniques already common in microelectronics. The external component that is used to reflect the directed beam is a plane mirror that is mounted a predetermined distance from the surface of the chip. In the specific embodiment disclosed, the holographic element consists of a grating that is lithographically formed on the surface of the chip over the optical sources, and the plane mirror is a reflecting surface of a transparent spacer whose thickness may be very accurately predetermined and which can be mounted or glued to the surface of the chip.

BRIEF DESCRIPTION OF THE DRAWINGS

The invention will be more readily understood after reading the following detailed description in combination with the drawings wherein.

DETAILED DESCRIPTION

Figure 1:
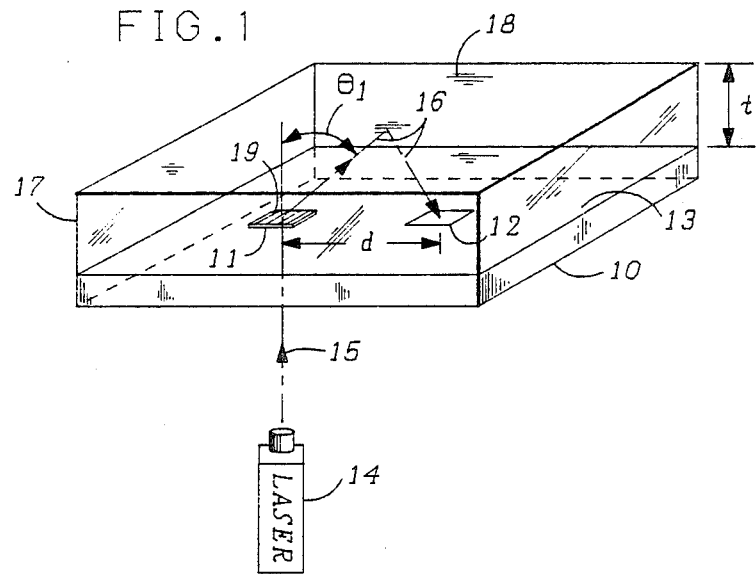
FIG. 1 shows a pictorial view of an optical connection apparatus and chip constructed in accordance with the present invention.
Figure 2:
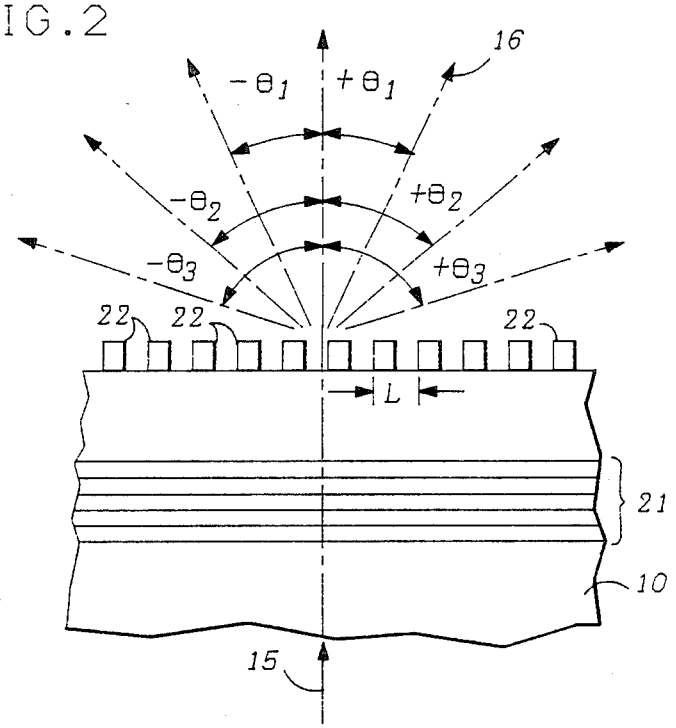
FIG. 2 is a cross-sectional view of an optical source with a holographic element which is useful in describing the operation of the present invention.

A specific embodiment of the invention is shown in pictorial form in FIG. 1. In FIG. 1 an integrated circuit chip 10 is shown having an optical source 11 and an optical detector 12, fabricated on a surface designated as 13 in FIG. 1. Optical source 11 may be a surface emitting laser or light-emitting diode, or as shown in FIG. 1, may be a quantum well modulator illuminated by a laser 14. A cross-section of the surface of chip 10 in the area of optical source 11 is shown in FIG. 2. As indicated in FIG. 2, optical beam 15 from laser 14 passes through an area of chip 10 which has a quantum well modulator 21 fabricated in the chip near the surface 13 of chip 10. Quantum well modulator 21 is a series of epitaxial growths having different bandgaps of the type described in U.S. Pat. No. 4,525,687 issued to Daniel S. Chemla et al. on June 25, 1985.

As further indicated in FIG. 1 and FIG. 2, a grating 19 consisting of stripes of photoresist material 22 is fabricated over the quantum well modulator that has been grown within chip 10. The grating 19 is developed on the surface of chip 10 in a manner to be described hereinafter. This grating causes the light beam 15 from the laser 14 to be diffracted in several directions corresponding to the different orders of the grating as shown in FIG. 1. When the light beam 15 is substantially perpendicular to the surface of the chip 10 on which the grating 19 is formed, these light beams at the output of the grating are positioned at angles relative to the perpendicular corresponding $\pm\theta_1$, $\pm\theta_2$, $\pm\theta_3$, and so on, when $\theta_m$ satifies the eqation $$\sin\theta_m = \frac{m\lambda}{nL} \tag{1}$$

where m=a positive integer, L=the period of the grating, $\lambda$=the wavelength of the incident light in free space, and n=the index of refraction of the medium above the grating (i.e. the spacer medium 17 in FIG. 1).

As shown in FIG. 1, the period of the grating L is chosen such that light beam 15 after being modulated by quantum well modulator 21 in chip 10 is deflected by the grating 19 such that optical source 11 has a beam 16 which is emitted from the surface 13 at an angle $\theta_1$. This beam 16 proceeds through a sapphire spacer block 17 having a thickness t and is reflected by a plane mirrored reflecting surface 18 which has been formed on the top surface of spacer block 17. This reflecting surface 18 is provided by a silver deposit over the sapphire spacer block 17 which may alternatively be fabricated from a glass material. After reflection by the plane mirrored surface 18, beam 16 proceeds to an optical detector 12.

As shown in FIG. 2, a grating 19 has photoresist stripes having a width of L/2 separated by a distance of L/2 thereby resulting in a grating having a period of L. This grating is formed (using a lithographic mask and a process to be described hereinbelow) such that it covers the entire area of the quantum well modulator 21 in chip 10. Where the glass spacer block 17 has a thickness t, its refractive index is designated by n, and the separation between source 11 and detector 12 is a distance d, the grating period L should be choosen according to the following formula:

$$L = \frac{\lambda}{n\sqrt{1 + (2t/d)^2}} \quad (2)$$

where $\lambda$ is the wavelength of the illuminating light beam 15 in free space. This causes the first order diffracted light beam 16 which is positioned at the angle $\theta_1$ from the perpendicular to be reflected by surface 18 such that impinges on detector 12.

As indicated hereinabove, the grating 19 consisting of photoresist stripes 22 is formed on surface 13 of chip 10 by using standard lithographic techniques. As a result this grating can be very precisely positioned over the optical source with its stripes running along a direction that is perpendicular to a line drawn between the centers of source 11 and detector 12. In the embodiment shown, the grating is formed by the photoresist material itself. It should be understood, however, that gratings can also be formed by etching the surface of chip 10. This surface of chip 10 alternatively may be of some dielectric material, such as polyimide or silicon nitride or silicon oxide prepared by thermal evaporation.

To deposit the photoresist material, the substrate is first baked at 130 degrees C. for thirty minutes and then allowed to cool at room temperature. A positive photoresist, for example, AZ4110 from the American Hoechst Corporation is then spun onto the substrate at 7,000 RPM for thirty seconds. The whole structure is then baked at 90 degrees C. for twenty minutes. The photoresist is then exposed through an appropriate grating mask having stripes with a periodicity L selected by the above equation (2). After exposure, the photoresist is developed for three minutes in AZ400K developer (also available from the America Hoechst Corporation) with the developer diluted with four parts of deionized water for every one part of developer. The photoresist is then rinsed in deionized water.

Details of the photoresist deposition, and exposure and development techniques are contained in the publications "AZ®4000 Series Positive Photoresists for Semiconductors and Microelectronics" and "AZ®400K Developer Aqueous Developer for AZ®4000 Series Positive Photoresists", both available from American Hoechst Corporation, AZ Photoresist Products, 3070 Highway 22 West, Somerville, N.J. 08876, U.S.A.

The diffraction efficiency of the grating thus formed may be adjusted by adjusting the thickness of the grating. A systematic way of choosing the grating thickness to give the desired diffraction efficiency for a given wavelength is to make several gratings using different spin speeds between 3000 and 7000 rpm and to choose the one that gives best diffraction efficiency. Additionally, other AZ 4000 series resists can be used, such as AZ 4040 for thinner gratings or AZ 4210 for thicker gratings. Again the spin speed may be varied to optimize the thickness. Another technique is to make several gratings using different dilutions of an AZ 4000 series resist using AZ 2131 thinner, and choose the one with the best diffraction efficiency. Such gratings can be employed in the visible and near infrared spectral regions.

Figure 3:
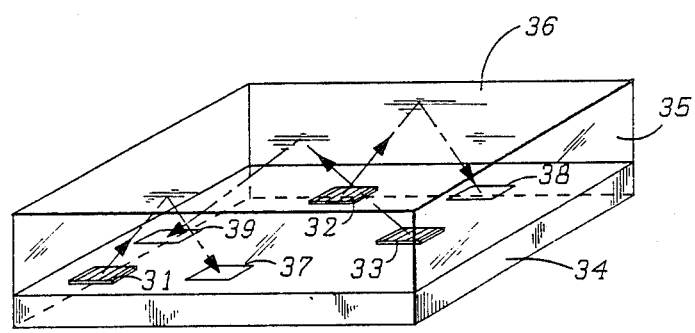
FIG. 3 is a second embodiment of the invention wherein there are a plurality of optical sources and detectors on the surface of the chip.

What has been described hereinabove is an embodiment of the invention wherein a single source and detector are optically connected. It should be apparent to those skilled in the art that several optical sources and detectors can be interconnected on the same chip. In FIG. 3, gratings 31, 32 and 33 are fabricated over optical sources in chip 34. These optical sources, as pointed out hereinabove, may be surface emitting lasers, light-emitting diodes, or external lasers with quantum well modulators of the type shown in FIG. 2. Each of the gratings is fabricated in accordance with FIG. 1 hereinabove such that they diffract the beams of light before coupling them to the reflecting surface 36 at the top of transparent spacer block 35. By choosing the correct grating periodicity for each of the gratings the light is reflected from reflecting surface 36 such that the beams impinge upon the optical detectors 37, 38 and 39, each of which is fabricated on the surface of chip 34.

What has been described hereinabove are illustrative embodiments of the present invention. Numerous departures may be made by those skilled in the art without departing from the spirit and scope of the present invention. For example, other materials and techniques can be utilized to position the reflecting surface a predetermined distance from the holographic elements that as fabricated on the surface of the chip.

What is claimed is:

1. In combination, a chip having at least one optical source for providing a light beam out of said chip and at least one optical detector for receiving light coupled to said chip at a point that is spatially remote from said optical source, diffracting means fabricated in material grown over said optical source for directing a light beam from said optical source along a predetermined path, and means positioned a predetermined distance from said diffracting means for reflecting the directed light beam to said optical detector.

2. The combination as defined in claim 1 wherein said diffracting means comprises stripes of photoresist material grown on the surface of said chip.

3. The combination as defined in claim 1 wherein said means for reflecting the directed light beam includes a transparent spacer block and a reflecting material deposited on one surface of said spacer block.

4. Apparatus comprising a chip having at least one optical source which provides a light beam out of said chip and at least one optical detector for receiving light coupled onto said chip at a point that is spatially remote from said optical source, and a structure attached to said chip for coupling light from said at least one optical source to said at least one detector;

characterized in that said structure includes a diffraction grating fabricated in materials grown over said at least one optical source of directing a light beam from said optical source along a predetermined path, and a mirror positioned a predetermined distance from said diffraction grating for reflecting the directed light beam to said optical detector.

5. Apparatus as defined in claim 4 wherein said diffraction grating is fabricated from stripes of photoresist material which are deposited on the surface of said chip.

6. Appparatus as defined in claim 4 wherein said mirror comprises a transparent spacer block having a reflecting material deposited on one surface of said spacer block.

* * * * *